United States Patent [19]

Blandin

[11] Patent Number: 4,782,291

[45] Date of Patent: Nov. 1, 1988

[54] METHOD AND APPARATUS FOR THE TESTING OF ACTIVE OR PASSIVE ELECTRICAL DEVICES IN A SUB-ZERO ENVIRONMENT

[76] Inventor: Bruce A. Blandin, 698 LaFayette Dr., Hampton, N.H. 03842

[21] Appl. No.: 784,390

[22] Filed: Oct. 4, 1985

[51] Int. Cl.[4] .................... G01R 31/02; G01R 31/28
[52] U.S. Cl. ............................ 324/158 F; 324/73 R; 324/158 R
[58] Field of Search ............ 324/158 F, 158 P, 158 R, 324/73 PC, 73 R; 62/125; 209/573

[56] References Cited

U.S. PATENT DOCUMENTS

| 3,949,295 | 4/1976 | Moorshead | 324/158 F |
| 4,115,736 | 9/1978 | Tracy | 324/158 F |
| 4,172,993 | 10/1979 | Leach | 324/73 PC |
| 4,478,352 | 10/1984 | Amundson et al. | 324/158 F |
| 4,588,092 | 5/1986 | Moechnig et al. | 324/158 F |

Primary Examiner—Ernest F. Karlsen
Attorney, Agent, or Firm—Robert K. Tendler

[57] ABSTRACT

A batch processing system and unit for testing electrical components in a sub-zero environment includes an isothermal chamber which mates easily with the test heads associated with conventional automatic testing equipment and which eliminates thermal gradients and variable test conditions as well as eliminating frost contamination of test heads, costly fixturing for the various types of semiconductor chip packages or passive components and static charge. The utilization of a single isothermal soak chamber provides that all devices under test and a test socket mounted on a card secured to a fixture at the bottom of the chamber are cooled to the same temperature by moisture-free gas introduced into the chamber. It is a feature of the subject invention that the test head, located outside the chamber, is well insulated from the chamber. The chamber, with all internal parts and devices, is cooled down until all parts are at the same temperature. At this time, the devices in the chamber are plugged into the socket, tested and moved to another portion of the chamber, such that all testing is done in an isothermal environment.

9 Claims, 4 Drawing Sheets

METHOD AND APPARATUS FOR THE TESTING OF ACTIVE OR PASSIVE ELECTRICAL DEVICES IN A SUB-ZERO ENVIRONMENT

FIELD OF INVENTION

This invention relates to environmental and electrical testing of semiconductor or like components in a sub-zero environment and, more particularly, to a system which mates easily with all types of automatic test equipment, eliminates test head freeze-up and permits rapid adaptation to different size semiconductor and other packages, while at the same time, assuring uniform test temperature conditions.

BACKGROUND OF THE INVENTION

Currently and in the past, there has been the need to electrically test semiconductors in a sub-zero environment. With military, aerospace and commercial test specifications becoming more stringent, the need for this type of testing is growing rapidly.

In the past, semiconductor devices have been tested for their operation in sub-zero environments by first placing the device in an environmental chamber and cooling the device to −55° C. for sometimes as long as ten days. The devices were then taken out of the chamber and tested at room temperature to ascertain the effects of the previous exposure to low temperatures. No attempt was made to test the function of the device in the chamber while the device mass was stabilized at −55° C.

Newer systems have attempted to test the operation of semiconductor devices while at sub-zero temperatures, but these systems are configured for only one type and size of device and have, in the main, resulted in freeze-ups and erratic results as will be subsequently described.

One of the important problems with the prior art systems is the freeze-up of the so-called "test head," which in general, is a unit which houses the drive circuitry for the functional testing of a particular device. These units typically have ten to twenty integrated circuits mounted to printed circuit boards within the test head. At the top of the unit is a printed circuit load board, usually circular in configuration, which transmits the test signals to a central socket into which the device under test (DUT) is plugged. As will be described, freeze-up of the circuits in the test head is a problem that affects the results of the functional test being performed.

In the first of the automated units to be described, the test head is insulated from the test site, but leakage causes test head malfunction and freeze-up nonetheless. In the second of the systems to be described, no attempt is made to insulate the test head circuits from sub-zero gases used to cool the device under test. Thus, in both of the systems to be described, test head freeze-up is a significant problem.

For instance, in completely automatic systems such as the Automatic Device Handler manufactured by Trigon Industries of Mountain View, Calif., several input slides are utilized. Means are provided for moving the individual devices from the input slides to a test site. Gangs of contact pins at the test site are then actuated to contact the device, and the device is then tested. After testing, the device is channeled to one of two output slides, depending on whether or not the device meets the test criteria. In this type of equipment, the device is initially cooled or presoaked after it is loaded into the input slide, and it is further cooled at the test site to bring it to the desired temperature. The reason for the subsequent cooling at the test site is that there are temperature variations that occur during handling. These temperature changes are primarily responsible for condensate and subsequent freezing. After test, the device is allowed to return to ambient as it is removed from the test site and exits down an output slide.

What will be appreciated in this automatic loading and unloading system is that the slide configurations as well as the test site configuration must be changed to accommodate different sizes of semiconductor packages or components, which is an extremely costly endeavor. Also, one handler can accommodate only one type of device, currently either a dual-in-line package (DIP) or a leadless chip carrier (LCC). At the present time, automatic handlers are not available for flat packs, transistor outline (TO) packages, axial lead components or pin grid arrays.

Thus, for certain packages, there is no possibility of a retrofit because the package configurations preclude conventional automated contacting and device handling. Even if such fixturing exists, the only way to test a given type of device is to purchase a testing unit dedicated to a particular type of device and then to buy retrofit kits for each size.

In addition to the difficulty in retrofitting such a machine for different sizes of devices, it is with extreme difficulty that the temperature in the presoak section can be made to match the test site temperature, with the result that condensate occurs which causes freeze-ups and jamming. Also, even if the test site is calibrated with a time-temperature profile for a given semiconductor device, the actual temperature of the device under test is not directly measured. Rather, it is the refrigerated gas stream temperature which is measured, and this leads to inaccurate results. Moreover, cold air often leaks from the internal test site to the external test head which causes moisture in the air surrounding the external test head to freeze. This, in turn, freezes up the external test head even though the test head is insulated from the test site.

In addition to the test head freeze-up problem with such automated equipment, there is also the problem that the mechanical sorting apparatus heats up the devices to be tested, either due to the internal friction during the handling process or due to the amounts of energy delivered to the solonoids utilized in moving the devices from one position to another. This energy dissipates to the test environment and alters the test environment in both an uncontrolled and unsensed manner.

Thus, if the testing of any given device is to be at −55° C., while it is possible to initially cool down all of the devices in the slides to −55° C. in a presoak cycle, the temperature of their mass may be altered when they are moved to the test site which is invariably at a different temperature. This leaves devices at an unestablished temperature at the test site. In order to test such devices, they must be brought back to a predetermined test temperature at the test site, which requires the calculating of another time-temperature soak profile.

Moreover, unless extraordinary measures are utilized to remove all moisture, freeze-ups occur inside the unit at the test site which can result in the jamming of all moving parts. At this point, the test site must be opened and exposed to the ambient until all parts thaw. Unfortunately, moisture carried in room air is deposited on the test site, and unless the test site is thoroughly dried, it will freeze up again. It will be noted that the test site, along with its actuating apparatus and its delicate, closely-packed lead frame structure, is within the environmental chamber which subjects all test site leads and movable contacts to the possibility of freeze-up, condensation-caused shorting or unwanted resistance and capacitance between leads.

Having described in some detail certain types of automatic device handlers which are dedicated devices utilizing slides and manipulators, and in an effort to provide a device which will work with all types of test heads, temperature-forcing systems are currently used in which the device, test socket and test head are encapsulated in a chamber which comes down over the entire test head assembly. A robot arm, along with a cylindrical chamber opened at its base, comes down over the entire test head and is sealed at its base to the socket by a rubber pad which overlies the test head and has a hole in it through which the socket projects. The individual device is then cooled by the introduction of cooled dry gas into the chamber which floods the entire test head.

The first problem with respect to this type of testing is that it often takes three to five minutes to cool down the device under test, which is a prohibitively long period of time. Moreover, the cool-down period is extremely critical since, in these devices, there is no temperature sensing of the mass of the device. Rather, a time-temperature profile is utilized which assumes that the mass is at the correct temperature when a certain period of time has elapsed. Not only may this assumption be inaccurate, operators of such machines are often unable to effectuate proper testing due to the boredom associated with waiting minutes for the device to cool down. As a result, the length of cool-down time is either underrun or overrun due to operator error.

The second problem is that the entire test head and device under test are exposed to room air prior to the robot arm moving the cylindrical chamber into place. This captures the moisture in the air which condenses and causes test head freeze-up.

Thirdly, on cool-down, the whole test head is flooded with sub-zero gas, despite the rubber sealing normally used. This exposes all electronics in the test head to freezing gas which can cause electrical malfunction.

Thus, with respect to these thermal-forcing systems, since the entire test head is initially exposed to ambient conditions, moisture in the air is captured as the cylindrical chamber comes down. The result is significant freeze-up of all parts so that the testing throughput is severely limited. Additionally, the rubber pad on which the cylindrical test chamber comes to rest has to be changed as frequently as the DUT configuration is changed, such that the expense for the utilization of this robot-actuated encapsulation chamber increases dramatically. Further, the entire procedure results in the build-up of electrostatic charge which precludes accurate test results.

More specifically, every time the cooled cylinder is removed, all parts of the test head are exposed to room air which is moisture-laden. This causes condensate to form on the test head, and, after a few tests, the condensate freezes up. If this were not enough of a problem, there are problems in temperature control because temperature-forcing systems are based on the use of cold forced air applied for a highly critical period of time. To determine the soak time, calculations are made which are supposed to ensure that the device under test is at a specific temperature. Since no temperature sensors are located on the device under test, the above procedure is only approximate, and even if the calculations correspond to what is actually occurring, soak time is still critical and can vary depending on the amount of condensate that builds up between tests. To correct this, the test head must be allowed to thaw to room temperature every few devices. This results in the deposit of even more condensation from the air, which occurs when the forcing system is removed from the test head for a long period of time, causing even greater freeze-ups.

SUMMARY OF THE INVENTION

Instead of utilizing the aforementioned automated system with its inability to control temperature and its high cost of retrofitting, and instead of utilizing a test fixture which comes down over the entire test head with the problems of freeze-ups and long soak times, in the subject invention, an enlarged single test chamber is utilized in which all devices to be tested are located in racks or shelves within the test chamber. The bottom of the test chamber carries only the DUT socket on a DUT card utilized for the particular test. Dry, cooling gas enters the side or top of the chamber, and the test chamber is provided with a viewing port and apertures through which insulated gloves protrude.

In one embodiment, once thermal equilibrium is established, the devices are manually moved from their respective shelves to the DUT socket and then to other shelves, with all components being kept in isothermal surroundings. This system completely eliminates test head freeze-ups, since the test head is located beneath the chamber and is thermally insulated from the interior of the chamber. The test head is connected to the DUT socket through a unique thermally insulated interface which, in one embodiment, utilizes a snap-on plate and an upwardly-projecting socket mounted on a conventional test head which mates with a male contact which extends through the chamber insulation. As a result, the subject unit can be used with any test head or with any automatic testing equipment by simply rolling the subject device up to the automatic test equipment and snapping its test head to the bottom of the isothermal chamber.

The subject system, therefore, involves the testing of the operation of the electronic device while the device is maintained at a sub-zero controlled temperature, without the problems associated with prior art units.

While it might initially seem that such a manual system would be cumbersome due to its lack of automation, it has been found that soaking large numbers of devices in a single chamber in which the test takes place eliminates the problems of leakage, temperature variations, a long presoak time for each individual device and static electricity build-up. The result is that at least one order of magnitude improvement in throughput is achieved, while at the same time, dramatically improving the reliability of the test results. Manual manipulation of the devices may be replaced with automatic manipulation, if desired, since no temperature differentials exist in the chamber after thermal equilibrium is established and, thus, no condensate can form which would cause jam-ups.

In summary, a batch processing system adaptable to all types of automatic test equipment is provided which eliminates thermal gradients and variable test conditions as well as eliminating frost contamination of test heads, DUT fixtures, load boards and costly fixturing for the various types of semiconductor chip packages or passive components. Additionally, static charge problems are minimized, if not completely eliminated.

The system includes the utilization of a single isothermal soak chamber to which a conventional test head is attached via a suitable socket, and in which all devices and a DUT socket are cooled by moisture-free gas in the chamber and in which the test head is located outside the chamber and insulated therefrom. The chamber, with all internal parts and devices, is cooled down until all parts are at the same temperature. At this time, the devices in the chamber are plugged into the socket, tested and removed to another portion of the chamber, such that all testing is done in an isothermal environment and only after all apparatus in the chamber is cooled to the same low temperature. This eliminates the necessity of temperature profiling, since during the testing, neither the devices under test nor the socket are exposed to temperature variations which cause condensation or test variability. Nor are they exposed to ambient moisture-laden air which would cause freeze-ups or jamming.

Note that insulated gloves are provided through the face of the chamber to permit manipulation of the devices to be tested, and either magnets or forceps may be used for device manipulation, assuming they are cooled down with the rest of the apparatus in the chamber.

In operation, each device is manually removed from the shelf, plugged into the DUT socket which extends into the chamber, is tested for proper operation by testing apparatus outside the chamber, and is then placed in one of two racks or shelves, depending on the outcome of the test, with the uniform temperature maintained throughout the chamber being undisturbed by the manual manipulation. After testing of all devices, the chamber is opened and the tested devices are removed. Audio signals outside the chamber or visual signals inside the chamber may be used to alert the person performing the test as to whether or not the device under test has passed or failed the test. Thus, the operator need not take his eyes off the chamber to ascertain the status of a tested device.

The test chamber therefore eliminates long soak periods between device testing, since all devices within the test chamber are initially brought to the same temperature to provide for rapid testing once thermal equilibrium is established within the chamber. Thus, devices can be tested as fast as the operator can load a socket. Accommodation of different styles and sizes of packages is accomplished through the utilization of different easily removable sockets or DUT cards at the base of the test chamber, with the sockets or DUT cards being the only portions of the testing device which are exposed to the sub-zero uniform soak temperature. Since the socket and card are the only devices exposed to the uniform temperature soak, frosting of the test head, which is outside the chamber and is heavily insulated therefrom, is completely eliminated. Thus, the testing throughput, although manually done, is at least an order of magnitude faster than current testing apparatus.

BRIEF DESCRIPTION OF THE DRAWINGS

These and other features of the subject invention will be better understood in conjunction with the Detailed Description taken in conjunction with the drawings of which.

DETAILED DESCRIPTION

As mentioned before, there are currently two types of devices for ascertaining the operation of semiconductor devices in sub-zero environments.

Figures 1, 2A, 2B, 2C, 2D, 2E:
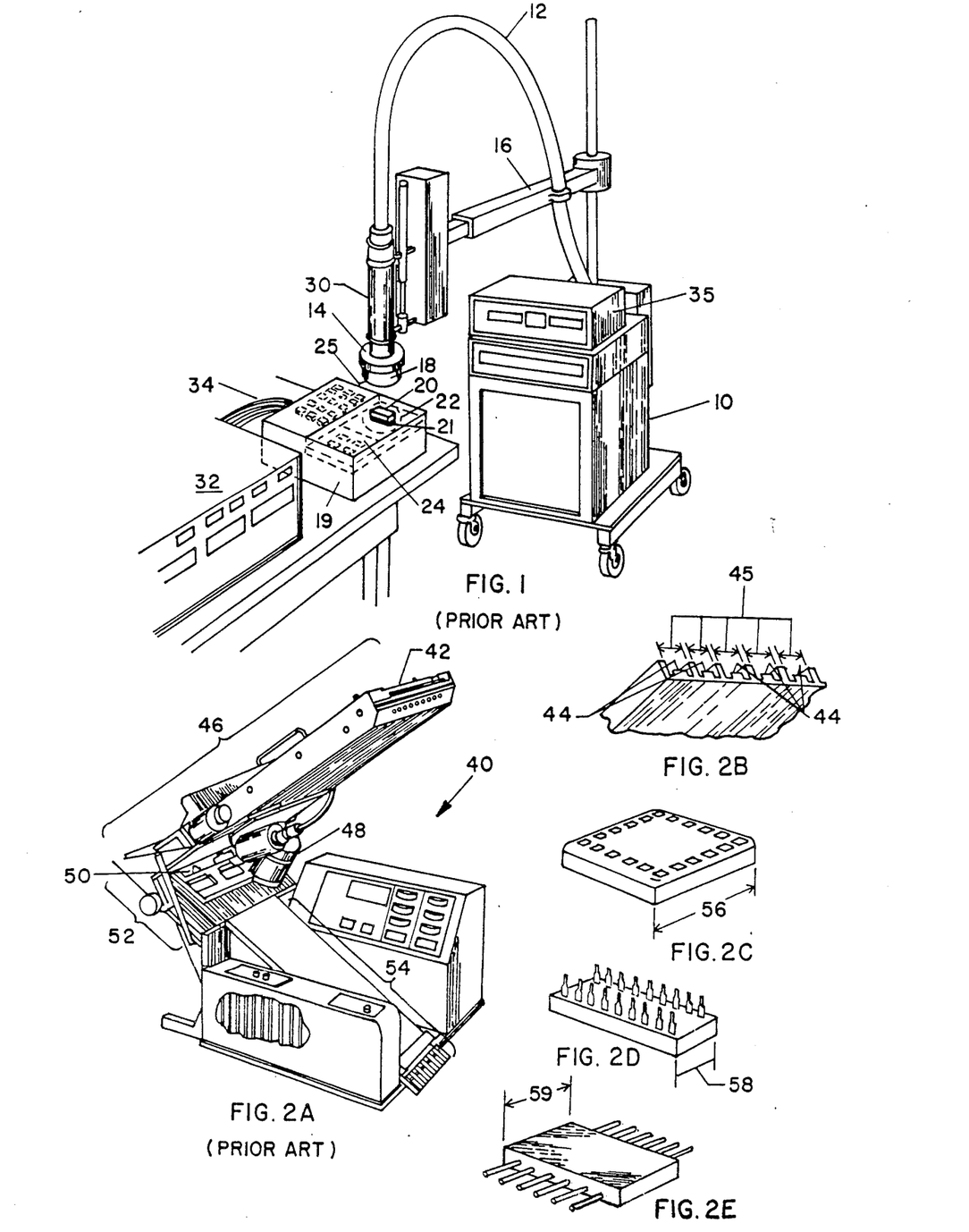
FIG. 1 is a diagrammatic representation of a prior art temperature-forcing system, illustrating a retractable head which comes down over the semiconductor device to be tested.
FIG. 2A is a diagrammatic illustration of a prior art automatic testing system involving an automatic device handler illustrating the presoak input channels, the test site and the exit channels.
FIG. 2B is a diagrammatic illustration of the slots or channels used throughout the device of FIG. 2A.
FIGS. 2C, 2D and 2E are diagrammatic illustrations of leadless chip carriers, dual-in-line and flat pack packages, illustrating the difference in sizes and configurations which preclude easy accommodation by the device of FIG. 2A.

The first of such devices, as illustrated in FIG. 1, is a thermal forcing system in which a refrigeration unit 10 forces cold fluid in the form of a gas through a line 12 to a retractable head assembly, generally indicated by reference character 14, which is carried on a robot arm 16, that positions an open-bottom, cylindrical chamber 18 over a test head 19, having a device under test (DUT) 20 inserted into a socket 21 on a load board 22, with socket 21 being surrounded by a rubber pad-type seal 24, which has a rectangular aperture in it. The lower edge 25 of the open-ended cylindrical chamber mates with the top surface of the rubber pad so as to seal the chamber to the test head. The programmed testing unit diagrammatically illustrated at 32 is used to control the test procedure and record the results.

In operation, the head 14 is brought down as indicated by double-ended arrow 30 over DUT 20 and is allowed to remain there, for instance, for a period of three to five minutes, whereby it is assumed that the mass of the device under test has reached the appropriate testing temperature, in one embodiment $-55°$ C. At this point, the device under test is tested via unit 32 by signals transmitted over a cable 34 and is put through a series of pre-programmed tests to determine its operability under a presumed uniform sub-zero condition. Unit 35 controls the temperature settings and flow rates. Once the test is completed, the robot arm is raised, and another device is loaded into socket 21.

Unfortunately, as mentioned above, the first problem associated with a temperature-forcing system, is that it is assumed that there is a time-temperature relationship which remains static throughout the testing procedure in that it is assumed that the mass of the device under test has reached and is maintained at the calculated temperature assuming a predetermined cool-down time has elapsed. This is an incorrect assumption in view of the variability of the conditions at the device under test. As can be seen clearly from the diagram, the device under test is exposed to ambient air prior to the encapsulation of the device by chamber 18. The variability of room conditions and temperatures makes such a simplistic testing procedure subject to errors which results in either a recalculation of temperature for each device or only very gross test results.

More importantly, even if the gas utilized in cooling the device is completely filtered and devoid of moisture, it will be apparent that the test head is exposed to moisture in the air within the room every time the arm is raised. This results in substantial freeze-up of the test head, DUT card, the load board and the socket into which the device under test is plugged. It also results in inaccurate test results due to frost on the DUT card, load board, the test head and the test head leads themselves which may, for instance, short out due to the frozen condensation. It will be appreciated that the load board may have many closely-spaced leads going to the socket in the form of a lead frame structure and that condensate between the leads results in unpredictable resistance paths or stray capacitance.

Moreover, if the socket utilized is, for instance, a zero-insertion-force type socket which is lever actuated, then the lever-actuated system may freeze as well. For those sockets which are not lever-actuated, the frost may form on the contact arms within the sockets.

In any event, the condensation problems are so severe with this type of automatic testing equipment that unfreezing of the DUT card, load board and test head is required sometimes for every fifth device. Moreover, the thawing of such a test head can take as long as several hours and subjects the entire test head to the moisture-laden air which results in even further freeze-up problems.

Referring now to FIG. 2A, a different type of automatic testing equipment is shown in which an automatic device handler 40 includes a channeled input slide structure surrounded by a presoak chamber, generally indicated at 42, which provides presoaking for a number of devices located in channels or feed slots 44, as illustrated in FIG. 2B, all of which have uniform widths as indicated by arrows 45. Note that the presoak chamber has a length illustrated at 46. It is the purpose of the presoak chamber to initially lower the temperature of the devices to be tested to some predetermined temperature. Thereafter, the apparatus shown generally at 48 is utilized to manipulate the devices in the feed slots to a test site 50 which, in general, includes solonoid-actuated devices which move one device at a time from each of a plurality of input slots to a test position in which gangs of contact pins are moved inwardly on opposite sides of the device to contact the upstanding leads from the device. The test site, generally indicated by 50, establishes a second, presumably controlled temperature zone, here illustrated at 52, which in the ideal situation, is not supposed to vary from the temperature of the presoak zone, so that the mass of the device under test does not change temperature in going from the presoak zone to the test site. If there is a temperature change when moving the device from presoak to test site, the temperature of the device at the test site must be recalculated.

Unfortunately, there is almost always a temperature differential between the presoak zone and the test site which necessitates re-establishing the time-temperature profile for the device by time-temperature profile calculations. Also, there is moisture-laden air which leaks in from the room. Upon device heating on transfer, this moisture condenses on the devices under test and on the solonoid-actuated test site equipment which causes freeze-up not only of the device manipulating equipment but also causes false readings due to condensation on the device leads, contact pads or the test site lead frame. Additionally, cold air leaks out from the test head socket to the test site which causes freeze-up and malfunction of the components of the test head.

Even more importantly is the fact that such an automatic device handler must be almost totally reconfigured for different size devices. This will be immediately apparent because, as illustrated in FIG. 2B, the input channels as well as the test site channels in section 52 and the output channels at 54 must be changed for each different size of device utilized. While there is some standardization within the industry, it will be appreciated that, as illustrated in FIG. 2C, a leadless chip carrier-type device may have a width as illustrated by double-ended arrow 56, whereas a dual-in-line package illustrated in FIG. 2D may have a much narrower width as illustrated by double-ended arrow 58. Moreover, the sizes vary even for the same package configuration. As seen in FIG. 2E, a flat pack has a different width, as illustrated by arrow 59, and has a contact configuration which currently cannot be processed by automatic device handlers. The result of the non-standardization of device packaging requires that sections 46, 52 and 54 be completely replaced or retrofitted, if possible, in order to accommodate different sizes of devices to be tested. Thus, not only is condensation and freeze-up a problem in the device of FIG. 2A, there is the additional problem of retrofitting the entire handler for different size devices to be tested. As a result, not only must the input slots and the output slots be reconfigured, but the test site must also be reconfigured.

It will be appreciated that for devices having upstanding leads, one type of contacting structure is necessary, whereas for leadless chip carriers which have contact pads, another type of test fixture is necessary. In short, the retrofitting of such a device is prohibitively complicated.

Figure 3:
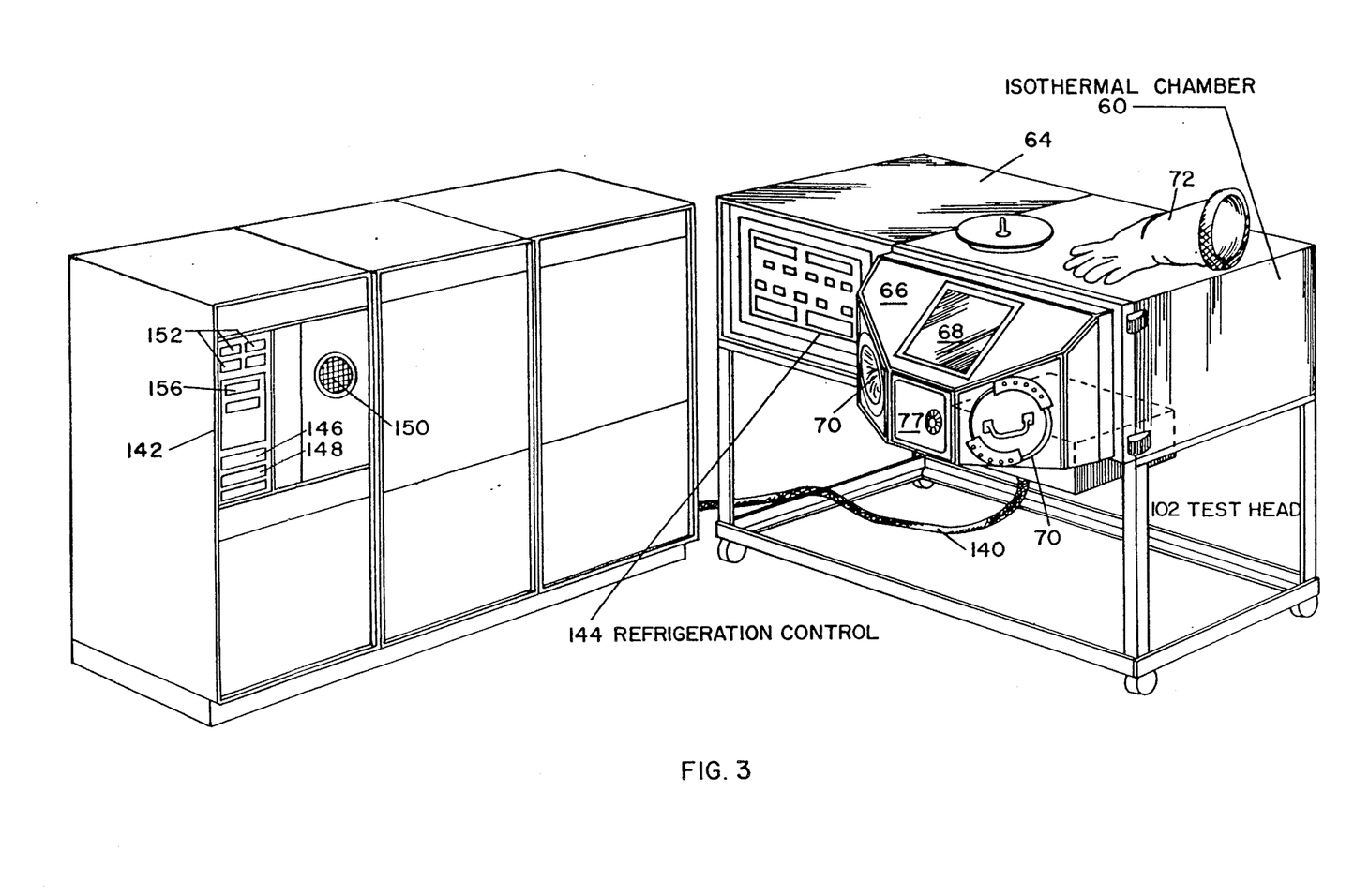
FIG. 3 is a diagrammatic representation of the subject system illustrating a batch processing isothermal soak chamber and associated refrigeration unit, testing unit and control unit.
Figure 6:
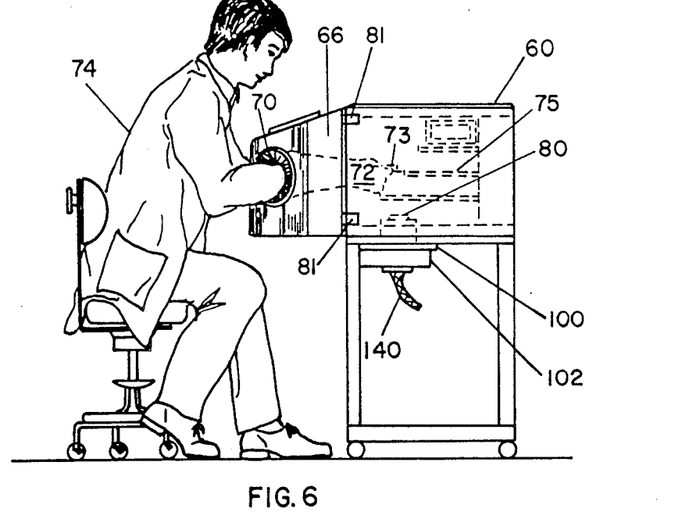
FIG. 6 is a diagrammatic illustration of an operator manipulating the devices to be tested in the isothermal chamber through the utilization of gloves which permit manual access to the interior of the isothermal chamber.

Referring now to FIG. 3, rather than utilizing either the temperature-forcing system of FIG. 1 or the automatic device handler of FIG. 2A; a single isothermal chamber 60 is utilized which is fed with moisture-free gas from an integral refrigeration unit 64. In a preferred embodiment, the refrigerating gas utilized is freon which cools dry air which is circulated after it has been filtered by a desiccant and has less than one percent water content. Isothermal chamber 60 is insulated at the top, bottom and sides with at least four inches of thermal insulation in one embodiment. The unit has a face portion, generally indicated by reference character 66, which includes a viewing port 68 and armholes 70 for gloves 72 so that devices 73 within the chamber can be manually moved, as illustrated in FIG. 6 by individual 74, who places both hands in the gloves to either side of face 66 through armholes 70, so as to be able to batch process a number of devices. He does this by picking a device 73 from a shelf 75, plugging it into a socket 80 on the floor of the chamber, testing it and moving it to another shelf in the chamber.

Figure 4:
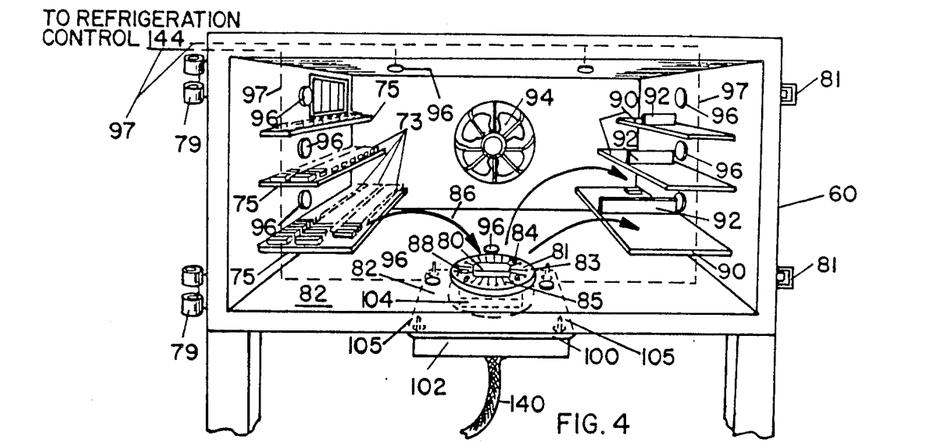
FIG. 4 is a front perspective view of the subject isothermal chamber illustrating the positioning of a test socket at the bottom of the chamber, the positioning of thermocouples to determine when thermal equilibrium has been established in the chamber, and also illustrating the processing flow path of the devices to be tested.

It will be appreciated that the isothermal chamber is provided with a front-loading door 77 or, as shown more completely in FIG. 4, the entire face 66 may be hingedly attached to the remainder of the chamber by hinges 79 and latch mechanisms 81 to permit device introduction and removal once the test is completed.

Referring to FIG. 4, the isothermal chamber 60 is shown as being provided with a socket 80 on a DUT card 81, which is removable from a DUT fixture 82 at the bottom of chamber 60. DUT card 81 is a printed circuit board having a circumferential set of contacts 83 which exist on the top and bottom surfaces of the cards such that vertically corresponding contacts are electrically connected through so-called "thru holes" or "vias." The top contacts are then connected via a lead frame structure 85 to socket 80. Note that socket 80 and card 81 are the only devices within the chamber that need to be removed and replaced in order to be able to test whatever configuration device is required. The devices to be tested are located on shelves 75 and are manually moved via gloves from the shelves, as illustrated by arrow 86, to the particular socket, which is located within the isothermal chamber. In the case illustrated, a zero-insertion-force connector is shown with a lever 88 into the chamber such that once the device to be tested is plugged into the socket and the lever 88 is actuated, the device is then tested for proper electrical operation and placed on shelves 90 to one side or the other of a divider bar 92, which separates the devices that have failed the test from those that have passed.

As will be discussed later, an audio or visual indication of a pass or fail may be given by the test controller 142 of FIG. 3 so that the operator need not take his eyes away from the viewing port. Additionally, synthesized voice commands can be given to the operator so that his eyes need not be diverted from the isothermal chamber.

Referring again to FIG. 4, a circulating fan 94 is utilized to provide a thermal equilibrium for the devices soaking, the device under test, the shelves and the socket, which are the only devices that exist in the chamber other than the gloves which extend into the chamber from the face thereof, or forceps or magnets. That a thermal equilibrium exists at a given temperature for the entire chamber, including the socket, may be established by a number of thermocouples 96 located at various points within the chamber which are coupled via lines 97 to a refrigeration control 144 of FIG. 3.

As can be seen from FIG. 4, a plate 100 carrying a test head 102, is provided underneath the chamber and is snapped to the bottom of the chamber such that a socket, indicated by dotted outline 104, mates with a downwardly-projecting contact structure from socket 80 so that socket 80 is attached to test head 102. An example of how this may be accomplished is illustrated in FIG. 5.

Figure 5:
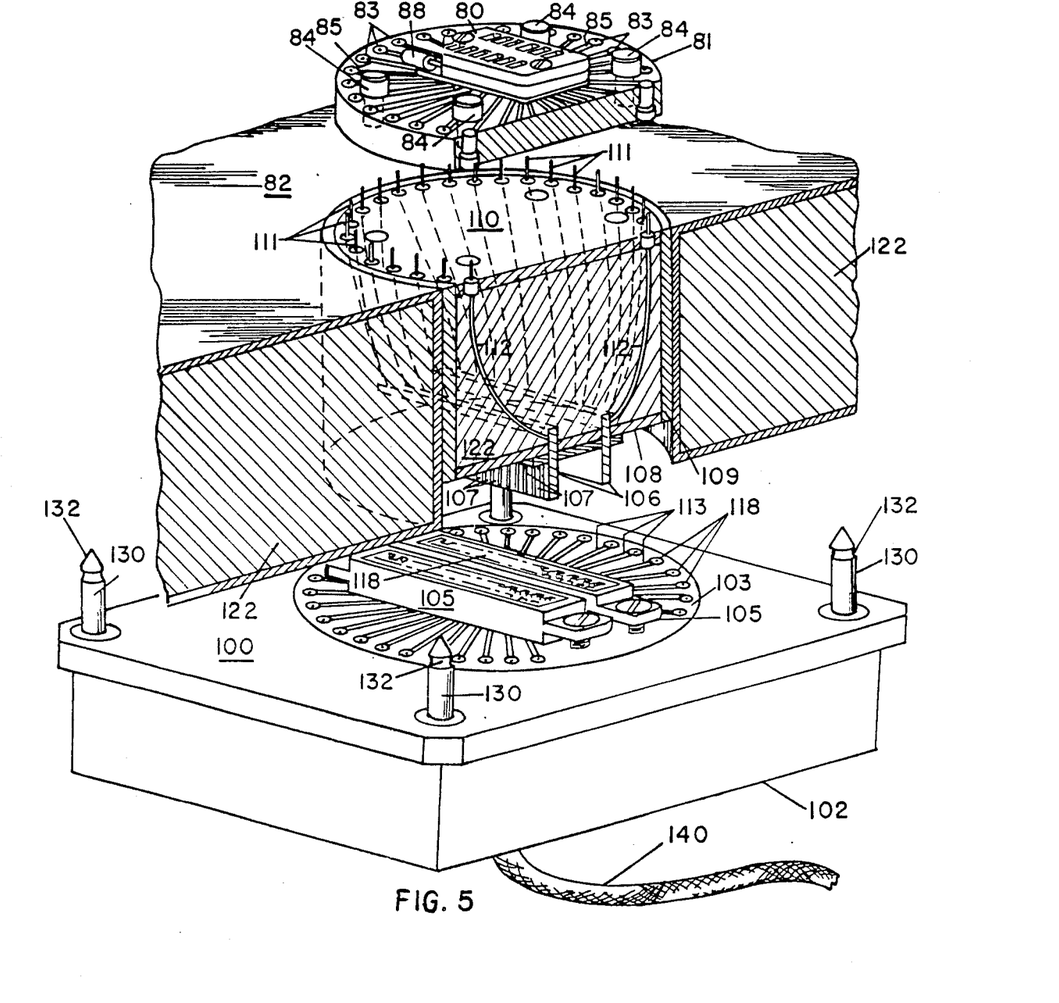
FIG. 5 is a diagrammatic and partial cross-sectional view of a portion of the bottom of the isothermal chamber of FIG. 4 illustrating the interfacing of the test socket to the socket carried by the isothermal chamber.

Referring to FIG. 5, test head 102 includes a load board 103 and sockets 105 mounted thereon, with downwardly-projecting cards 106 carrying longitudinal conductive stripes 107. These cards are mounted to a circular printed circuit card 108 at the base of a cylinder 109 through the base of the chamber which is filled with insulation 122. A top circular printed circuit card or DUT fixture 110 is located at the top of cylinder 109 and has a circumferential spring-loaded contact structure 111 in the form of "pogo" pins which mate with the contacts on the underneath side of DUT card 81, whereas DUT card 81 is clamped to DUT fixture 110 via screws 84. Cards 108 and 110 are interconnected via wires 112 or like devices which run through the insulation and connect cards 106 to the DUT card via DUT fixture 110 and pins 111.

The test head, along with plate 100, is insulated from the bottom 82 of chamber 60 so that the test head and its leads do not in any way freeze up, as was the case in the devices mentioned previously.

More specifically, test head 102 is illustrated diagrammatically as having a number of leads in the form of lead frame 113, going from an outside perimeter 118 to sockets 105 having apertures 118 adapted to co-act with conductive stripes 107 from boards 106, which are carried on insulated cylindrical base card 108. Stripes 107 have leads 112 which run through insulation carried in cylinder 109 which may be plastic. These leads are connected to DUT fixture 110 at base 82 of the chamber. The DUT fixture has spring-loaded "pogo" pins 111 about its periphery which mate with corresponding contact pads on the underneath side of DUT card 81. These pads have corresponding contact pads 83 and leads 85 on the top side which run to DUT socket 80, with the DUT card being clamped to DUT fixture 110 via screws 84. Thus, the entire DUT card and socket are readily removable for different types of devices to be tested. Here, lever 88 is illustrated to indicate that a zero-insertion-force socket is used, although such sockets are not necessary to the subject invention.

As can be seen, insulation generally indicated at 122, which in one embodiment, may be as much as four inches thick, isolates all of test head 102 and associated apparatus from the floor or base 82 of the isothermal chamber such that the test head 102, load board 103, sockets 105 and plate 100 are thermally insulated from the isothermal chamber.

What will be appreciated is that, in operation, all of the devices within the isothermal chamber, including the stored devices, the device under test, the shelves, the particular DUT socket, the DUT card utilized on the DUT fixture, fan, gloves, and forceps or magnets, if used, are brought down to the appropriate temperature for a sufficiently long period of time to ensure that every mass within the chamber is at the same temperature. Thus, thermal equilibrium is established over a given period of time and is not altered by the fact that hands are placed in the gloves or that the devices are manipulated. The only section of the test apparatus which extends into the chamber is the socket and/or DUT card which receives the devices for test, and no condensation occurs because the temperature is constant during the batch testing of all of the devices which have previously been cooled to the required temperature in the chamber. The above device therefore completely eliminates any freeze-up surrounding the socket or DUT card due to any differential in temperature which could cause condensation and therefore false test results of the devices subjected to the sub-zero environment.

Moreover, the test head assembly is completely beneath and insulated from the chamber such that the test head is maintained at room temperature. The result is that there can be no freeze-up of the test head or the leads going to the sockets which interface with the socket within the chamber because all leads to the outside of the chamber pass through the insulation.

Importantly, the only retrofitting that is necessary for different types of devices is the DUT socket or DUT card within the chamber. Thus, the subject device completely eliminates the retrofitting problems of utilizing slides and complicated specialized test sites associated with the automatic device handler described above.

Figure 7:
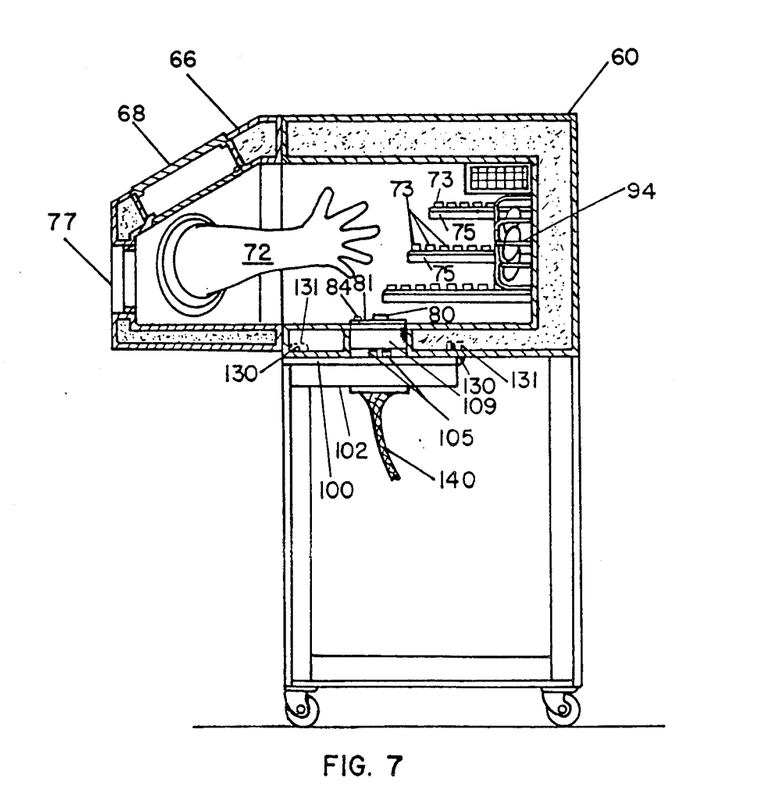
FIG. 7 is a diagrammatic and cross-sectional view of the isothermal chamber of FIGS. 3, 4 and 6, illustrating the manual manipulations of the parts to be tested and the insulation of the test head from the interior of the chamber.

In order to mate test head 102 with socket 80, all that is necessary is to press plate 100 up into the bottom of the isothermal chamber, with pins 130 serving to locate sockets 105 in a predetermined relationship with respect to boards 106. Thus, pins 130 serve to align sockets 105 while, at the same time, providing detent receiving grooves 132 so that all that is required to connect any conventional test head to a particular socket is to wheel the subject test chamber up to the conventional test head and snap plate 100 into position through the insertion of locating pins 130 into mating detent-type receptacles or sockets 131 within the bottom of the isothermal chamber, as shown in FIG. 7.

It will be appreciated that connection to the test head 102 is provided by cable 140 illustrated in FIGS. 3 and 4 which connects the test head to any conventional pre-programmed unit or tester 142, as illustrated in FIG. 3, so that the devices may be appropriately tested. In one embodiment, unit 142 is illustrated as having pass/fail indicators 146 and 148 on its front panel or, optionally, a speaker 150 and internal speech synthesizer circuitry (not shown) is provided to apprise the operator as to the condition of a tested device. Unit 142 may also be provided with the appropriate control switches or buttons 152 and a display 156. The aforementioned refrigeration unit control is provided to receive signals from the thermocouples located throughout the isothermal chamber such that, should any conditions change after the initial cool-down, the test may be aborted or the test results recomputed for whatever changes that might occur.

In summary, what is provided is batch testing of devices by an initial cool-down of all apparatus and masses within a single isothermal chamber which can be simply mated to any conventional test head. In the subject system, all device insertion into a fixture for test is done either manually or automatically, but with all device-manipulating apparatus initially cooled down to the same temperature so that there is a temperature equilibrium for all devices within the isothermal chamber. Since all devices within the isothermal chamber are at the same temperature, no temperature differentials exist which would cause condensation on the devices to be tested, and therefore, the results of using a single isothermal chamber and a batch processing method, while initially appearing to be non-automatic and therefore a slow method of testing in fact results in providing as much as one order of magnitude improvement in throughput as compared to the devices described previously. The improvement in throughput relates to the absence of soak times, condensation and freeze-ups, which are completely precluded by the subject device since no temperature changes occur from the loading of the particular device under test into the test socket to the removal of the tested device to a shelf in the isothermal chamber.

Additionally, the tests are exceedingly accurate because of the thermal equilibrium established within the single chamber. Devices are never exposed to ambient conditions, nor is it necessary to compute with any degree of accuracy a time-temperature profile for each device. Rather, because the devices are cooled simultaneously for a non-critical period of time, it can be assumed that all the devices are at the same predetermined test temperature. There is nothing in the isothermal chamber that adds energy to the system, and therefore, complicated time-temperature profiling is completely unnecessary.

As mentioned above, costly reconfiguration of input slots and test sites is unnecessary since the only thing within the isothermal chamber which is reconfigured for different devices is the particular DUT card and socket which is located at the base of the isothermal chamber. Since it is located outside of the isothermal chamber and at room temperature, the test head may be any conventional test head with appropriate sockets mounted thereon, since there are no critical parameters which must be avoided in order to prevent the aforementioned condensation and freeze-up. Also, static charge build-up is eliminated to a large extent, which improves the test results.

Thus, reconfiguring the isothermal chamber for different devices requires only the mounting of a different DUT socket or card within the chamber and the connection of this socket to any conventional test head through leads which extend form the bottom of the chamber. Thus, the chamber may be used with any automatic test equipment.

While the subject method and device have been described in a manual mode, it will be appreciated that automatic pick and position apparatus within the single chamber is within the scope of the subject invention. No jam-ups or freezing occur with this automatic apparatus because of the ease of sealing a single chamber and because no temperature variations routinely occur to produce condensation and freezing.

Having above indicated a preferred embodiment of the present invention, it will occur to those skilled in the art that modifications and alternatives can be practiced within the spirit of the invention. It is accordingly intended to define the scope of the invention only as indicated in the following claims.

I claim:

1. Apparatus for batch testing finished packaged electronic devices in a sub-zero environment, said packaged devices having semiconductor devices contained within said package, with conductors at least at a surface of the package comprising:

an isothermal chamber having insulated walls;
means for maintaining said isothermal chamber at a predetermined sub-zero temperature with a dry cooling fluid;
means for supporting the finished packaged devices to be tested within said chamber;
a test socket in said chamber having lead means extending exteriorly of said chamber through the insulation thereof;
means for moving a finished packaged device from a position within said chamber to said socket after all of the devices in said chamber are brought to said predetermined sub-zero temperature; and
means for providing test signals from a position exterior of the chamber via said socket lead means to the socket within the chamber to functionally test the devices therein at said sub-zero temperature, said finished packaged device moving means including means for removing a device from the socket after the tested device has been tested, the base of said chamber having detent mounting receptacles therein, said apparatus and further including a support plate having locator pins mounted upwardly therefrom and adapted to snap into said mounting receptacles in the bottom of said chamber, said support plate including a load board having a lead frame structure thereon and at least one socket extending upwardly therefrom, the base of said chamber having an aperture therethrough, a bottom circuit board in said aperture having downwardly-extending contact means adapted to mate with the socket on said load board, a top circuit board in said aperture and having said test socket thereon, said top circuit board having interconnected contact means on the top and bottom surfaces thereof, and means for electrically connecting said downwardly-extending contact means to the contact means at the bottom surface of said top circuit board, said aperture being filled with thermally insulating material between top and bottom circuit boards.

2. The apparatus of claim 1 wherein said downwardly-extending contact means includes vertically oriented circuit board means with electrically conductive stripes thereon.

3. The apparatus of claim 1 and further including a removable circuit board releasably attached to the top surface of said top circuit board and having electrical contacting means on the bottom surface thereof which mate with the contacting means on the top surface of said top circuit board, the socket in said chamber being electrically and mechanically attached to said removable circuit board, whereby the socket and associated board may be easily removed and replaced to acccommodate different types and sizes of devices to be tested.

4. The apparatus of claim 3 wherein the contact means on the top surface of said top circuit board includes spring-loaded contact pins which are adapted to mate with the contact means on the bottom surface of said removable circuit board.

5. Apparatus adaptable to any number of types of electronic device packages for batch testing in a sub-zero environment finished packaged electronic devices having connection means exterior to the package, comprising:

an isothermal chamber having insulated walls and means for opening said chamber to permit the deposit and withdrawal of devices to be tested;

means for maintaining said isothermal chamber at a predetermined sub-zero temperature with a dry cooling fluid;

means for supporting the finished packaged devices to be tested within said chamber;

test fixture means in said chamber and including means for contacting said exterior connection means on said package, said fixture means having lead means extending therefrom and exteriorly of said chamber through the insulation thereof;

means for moving a device from a position within said chamber to said fixture means after all of the devices in said chamber are brought to said predetermined sub-zero temperatures; and means for providing test signals from a position exterior of the chamber via said lead means to the test fixture means within the chamber to functionally test the devices therein, said device moving means including means for moving a device to said test fixture means, and for removing a device from said test fixture means after the tested device has been tested, the base of said chamber having detent mounting receptacles therein, said apparatus further including a support plate having locator pins mounted upwardly therefrom and adapted to snap into said mounting receptacles in the bottom of said chamber, said support plate including a load board having a lead frame structure thereon and at least one socket extending downwardly therefrom, the base of said chamber having an aperture therethrough, a bottom circuit board in said aperture having downwardly-extending contact means adapted to mate with said socket on said load board, a top circuit board in said aperture and having said test fixture means thereon, said top circuit board having interconnected contact means on the top and bottom surfaces thereof, and means for electrically connecting said downwardly-extending contact means to the contact means at the bottom surface of said top circuit board, said aperture being filled with thermally insulating material between top and bottom circuit boards.

6. The apparatus of claim 5 wherein said downwardly-extending contact means includes vertically oriented circuit board means with electrically conductive stripes thereon.

7. The apparatus of claim 5 and wherein said fixture means includes a removable circuit board releasably attached to the top surface of said top circuit board and having electrical contacting means on the bottom surface thereof which mate with the contacting means on the top surface of said top circuit board, the socket in said chamber being electrically and mechanically attached to said removable circuit board, whereby the socket and associated board may be easily removed and replaced to accommodate different types and sizes of devices to be tested.

8. The apparatus of claim 7 wherein the contact means on the top surface of said top circuit board includes spring-loaded contact pins which are adapted to mate with the contact means on the bottom surface of said removable circuit board.

9. The apparatus of claim 5 and further including means for alerting an operator of said apparatus to the status of a tested device without the operator having to remove his eyes from viewing the test socket in said chamber.

* * * * *